US012542263B2

(12) United States Patent
Harkness, IV et al.

(10) Patent No.: US 12,542,263 B2
(45) Date of Patent: Feb. 3, 2026

(54) CYLINDRICAL CATHODE AND CHAMBER USING SAME FOR SPUTTERING

(71) Applicant: INTEVAC, INC., Santa Clara, CA (US)

(72) Inventors: Samuel D. Harkness, IV, El Cerrito, CA (US); Thomas P. Nolan, Fremont, CA (US); Jae Ha Choi, Pleasanton, CA (US); Alexander Vassilievich Demtchouk, Sunnyvale, CA (US); Terry Bluck, Santa Clara, CA (US)

(73) Assignee: Intevac, Inc., Santa Clara, CA (US)

( * ) Notice: Subject to any disclaimer, the term of this patent is extended or adjusted under 35 U.S.C. 154(b) by 0 days.

(21) Appl. No.: 18/535,774

(22) Filed: Dec. 11, 2023

(65) Prior Publication Data

US 2024/0258087 A1 Aug. 1, 2024

Related U.S. Application Data

(60) Provisional application No. 63/434,048, filed on Dec. 20, 2022, provisional application No. 63/431,984, (Continued)

(51) Int. Cl.

| | |
|---|---|
| ***H01J 37/34*** | (2006.01) |
| ***C23C 14/35*** | (2006.01) |
| ***C23C 14/50*** | (2006.01) |

(52) U.S. Cl.

CPC .......... *H01J 37/3452* (2013.01); *C23C 14/35* (2013.01); *C23C 14/50* (2013.01); (Continued)

(58) Field of Classification Search

CPC ......... C23C 14/35; C23C 14/50; C23C 14/34; C23C 14/00; H01J 37/3452; (Continued)

(56) References Cited

U.S. PATENT DOCUMENTS 3,514,391 A 5/1970 Hablanian
3,864,239 A 2/1975 Fletcher
(Continued)

FOREIGN PATENT DOCUMENTS

EP 2509100 A2 10/2012
WO 2006097994 A1 9/2006
(Continued)

OTHER PUBLICATIONS

International Search Report for PCT International Application No. PCT/US23/83445, mailed Apr. 23, 2024, 2 pages.
(Continued)

*Primary Examiner* — Rodney G McDonald
(74) *Attorney, Agent, or Firm* — Mueting Raasch Group

(57) ABSTRACT

Sputtering system having cylindrical target with sputtering material on exterior surface; magnet arrangement inside the cylindrical target, having first set of magnets arranged on straight row, each having first pole facing interior wall of the target and second pole facing away from the interior wall, second set having plurality of magnets arranged in obround shape around the first set, each magnet having first pole facing away from the interior wall and second pole facing the interior wall; a keeper plate between the first set of magnets and the second set of magnets, such that straight line passing through an axis connecting the first pole and the second pole of a magnet from the second set intercepts the keeper plate prior to reaching the interior wall; and a cover.

21 Claims, 7 Drawing Sheets

Related U.S. Application Data filed on Dec. 12, 2022, provisional application No. 63/431,999, filed on Dec. 12, 2022, provisional application No. 63/431,969, filed on Dec. 12, 2022.

(52) U.S. Cl.
CPC ..... *H01J 37/3423* (2013.01); *H01J 2237/002* (2013.01); *H01J 2237/332* (2013.01)

(58) Field of Classification Search
CPC .. H01J 37/3423; H01J 37/342; H01J 37/3405; H01J 37/3455; H01J 2237/002; H01J 2237/332
USPC ........................................ 204/298.21, 298.22
See application file for complete search history.

(56) References Cited

U.S. PATENT DOCUMENTS

| | | | | |
|---|---|---|---|---|
| 4,428,816 | A | 1/1984 | Class et al. | |
| 4,434,037 | A | 2/1984 | Crank | |
| 5,026,471 | A * | 6/1991 | Latz | H01J 37/3408 204/192.12 |
| 5,106,474 | A | 4/1992 | Dickey | |
| 5,378,341 | A | 1/1995 | Drehman | |
| 5,997,705 | A | 12/1999 | Welty | |
| 6,365,010 | B1 * | 4/2002 | Hollars | C23C 14/35 204/192.12 |
| 8,470,141 | B1 | 6/2013 | Bernick | |
| 2004/0118678 | A1 | 6/2004 | Hartig | |
| 2005/0034666 | A1 | 2/2005 | Chistyakov | |
| 2007/0209934 | A1 | 9/2007 | Meyer | |
| 2008/0067057 | A1 | 3/2008 | German | |
| 2008/0308417 | A1 | 12/2008 | Hirata | |
| 2009/0277778 | A1 | 11/2009 | Stowell | |
| 2010/0093111 | A1 | 4/2010 | Inoue | |
| 2011/0209985 | A1 | 9/2011 | Li | |
| 2011/0229659 | A1 | 9/2011 | Reynolds | |
| 2011/0242662 | A1 | 10/2011 | Momoki | |
| 2012/0118733 | A1 | 5/2012 | Sasaki | |
| 2013/0153147 | A1 | 6/2013 | Senzaki | |
| 2013/0161183 | A1 | 6/2013 | Leahey | |
| 2014/0054168 | A1 | 2/2014 | German | |
| 2014/0102888 | A1 | 4/2014 | Harkness, IV et al. | |
| 2014/0334006 | A1 | 11/2014 | Adib | |
| 2015/0303041 | A1 | 10/2015 | Lindenberg | |
| 2017/0121819 | A1 | 5/2017 | Swaminathan | |
| 2017/0329352 | A1 | 11/2017 | Parkhe | |
| 2017/0372880 | A1 | 12/2017 | Hartig | |
| 2019/0043701 | A1 | 2/2019 | Harkness, IV et al. | |
| 2019/0226085 | A1 | 7/2019 | Jang | |
| 2019/0337841 | A1 | 11/2019 | Hart | |
| 2020/0158916 | A1 | 5/2020 | Hart | |
| 2020/0192002 | A1 | 6/2020 | Bellman | |

FOREIGN PATENT DOCUMENTS

| | | | |
|---|---|---|---|
| WO | 2024123879 | A1 | 6/2024 |
| WO | 2024124217 | A2 | 6/2024 |
| WO | 2024129773 | A1 | 6/2024 |
| WO | 2024129784 | A1 | 6/2024 |
| WO | 2024137879 | A2 | 6/2024 |

OTHER PUBLICATIONS

Written Opinion for PCT International Application No. PCT/US23/83445, mailed Apr. 23, 2024, 7 pages.
Request for re-examination for Taiwanese Patent Application No. 112148303, dated Mar. 4, 2025, 5 pages.
Dobrowolski, (eds. Bass et al.). "Chapter 42: Optical Properties of Films and Coatings", Handbook of Optics, vol. I: Fundamentals, Techniques, and Design, (1995); pp. 42.3 to 42.130.
International Search Report for PCT/US2023/82684, Apr. 18, 2024, 2 pages.
Written Opinion for PCT/US2023/82684, Apr. 18, 2024, 4 pages.
International Search Report for PCT/US2023/083250, May 23, 2024, 4 pages.
Written Opinion for PCT/US2023/083250, May 23, 2024, 5 pages.
International Search Report for PCT/US2023/083688, Apr. 23, 2024, 2 pages.
Written Opinion for PCT/US2023/083688, Apr. 23, 2024, 8 pages.
International Search Report for PCT/US2023/083700, Apr. 3, 2024, 2 pages.
Written Opinion for PCT/US2023/083700, Apr. 3, 2024, 7 pages.
International Search Report for PCT/US2023/085247, Jun. 5, 2024, 4 pages.
Written Opinion for PCT/US2023/085247, Jun. 5, 2024, 6 pages.
International Preliminary Report on Patentability for PCT/US2023/82684, Apr. 18, 2024, 5 pages.
International Preliminary Report on Patentability PCT/US2023/083250, May 23, 2024, 8 pages.
International Preliminary Report on Patentability for PCT/US2023/083688, Jun. 12, 2025, 9 pages.
International Preliminary Report on Patentability for PCT/US2023/085247, Jun. 24, 2024 7 pages.
International Preliminary Report on Patentability for PCT/US2023/083700, Apr. 3, 2024, 8 pages.

* cited by examiner 130
107
17
102
100
135

107
17
135
100

120
111
115
112
105
100
114
113

132
130
100

105
110
130
A
A

CYLINDRICAL CATHODE AND CHAMBER USING SAME FOR SPUTTERING

RELATED APPLICATIONS

This Application relates to and claims priority benefit from U.S. Provisional Application Ser. No. 63/434,048, filed on Dec. 20, 2022, and from U.S. Provisional Application Ser. No. 63/431,999, filed on Dec. 12, 2022, and from U.S. Provisional Application Ser. No. 63/431,984, filed on Dec. 12, 2022, and from U.S. Provisional Application Ser. No. 63/431,969, filed on Dec. 12, 2022, the disclosures of which are incorporated herein in their entirety.

BACKGROUND

Field

This Application relates to cathode for physical vapor deposition and to system used in physical vapor deposition to form thin film coatings on articles.

Related Arts

With the huge popularity of mobile devices, such as, cell phones, smart watches, VR goggles and other devices, which have optical displays, there is a growing need to protect these devices from handling damage which degrades their appeal. Transparent panels (glass or plastic) that are used to protect optical displays need to be optically clear, have high transmission, low reflectivity, and be scratch and scuff resistant. The resistance of the panels to scratch and scuff can be enhanced using coatings which does not degrade the optical properties of the panel. Such coatings can be formed using a physical vapor deposition (PVD) process, otherwise known as sputtering.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiments provide magnet arrangement for a cylindrical cathode, which enables enhanced control of plasma confinement. The magnet arrangement is specifically designed for a cylindrical target, which enables coating large substrates or multiple smaller substrates simultaneously. A sputtering station is provided, which utilizes two cylindrical targets that sputter the same material onto the substrate(s) simultaneously. Gas is injected between the two targets for interaction with the sputtered material (e.g., oxygen or nitrogen).

With this disclosure, a sputtering system is provided, comprising: a cylindrical target having sputtering material on exterior surface thereof, a magnet arrangement provided inside the cylindrical target, the magnet arrangement comprising a first set of magnets arranged on a single straight row, each magnet of the first set having a first pole facing interior wall of the cylindrical target and a second pole facing away from the interior wall, a second set of magnets arranged in a obround shape around the first set, each magnet of the second set having the first pole facing away from the interior wall of the cylindrical target and the second pole facing the interior wall; a keeper plate positioned between the first set of magnets and the second set of magnets, such that a straight line passing through an axis of a magnet from the second set intercepts the keeper plate prior to reaching the interior wall, while a straight line passing through an axis of a magnet from the first set reaches the interior wall without having to intercept the keeper plate; and a cover enclosing the second set of magnets between the cover and the keeper plate. The keeper plate may have a cross-section resembling a U-shape with angled extensions at each end of the U-shape opposing the valley of the U shape.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1A schematically depicts a top view of the magnet arrangement with all other parts of the magnetron removed for clarity, according to an embodiment;

FIG. 1B schematically depicts a cross section of the magnetron assembly along line A-A in FIG. 1A, according to an embodiment;

FIG. 1C schematically illustrates a cross section of one cylindrical target with the magnetron inserted therein, according to an embodiment;

FIG. 1D is a schematic illustrating a cross-section of a sputtering chamber having one cylindrical target with one magnetron inserted therein, according to an embodiment, while FIG. 1E is a schematic illustrating a cross-section of a sputtering chamber having one cylindrical target with two magnetrons inserted therein, according to an embodiment;

FIG. 2 schematically illustrates a cross-section of a sputtering chamber having two cylindrical targets, according to an embodiment, while

DETAILED DESCRIPTION

Various embodiments will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

Figures 1A, 1B, 1C, 1D, 1E:
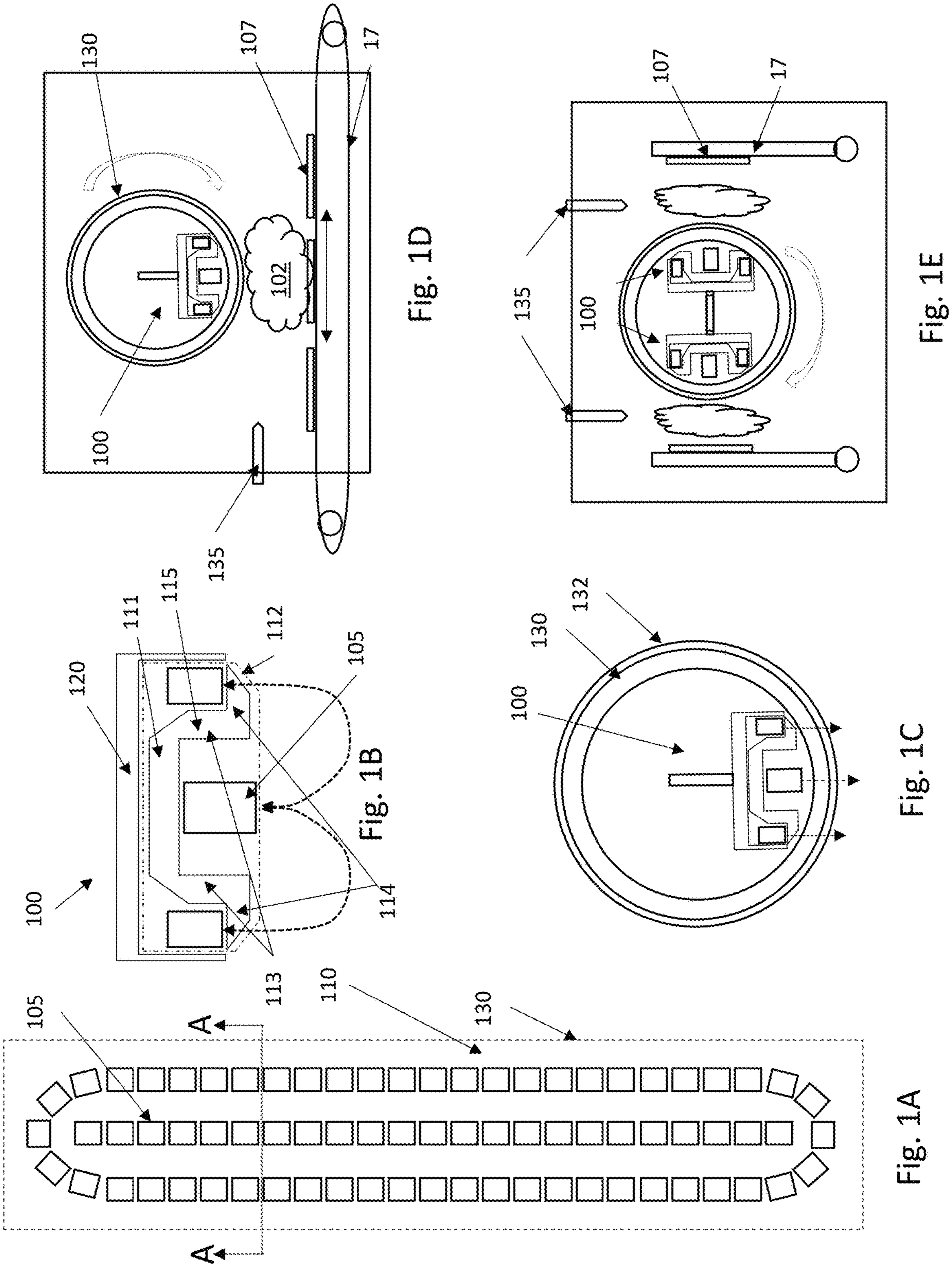

FIG. 1A schematically illustrates the arrangement of a first set of magnets and a second set of magnets, in a top view. The first set of magnets 105 is arrange on a straight line, with all of the magnets of the first set oriented with the same polarity. The second set of magnets 110 is arranged with the magnets in an obround shape, colloquially sometimes referred to as race-track shape, around the first set 105. Incidentally, an obround shape is a shape having the form of a flattened cylinder with the sides parallel and the ends hemispherical, i.e., the magnets are arranged as two parallel line segments connected at each end with a semicircle. Stated another way, it is a plane shape consisting of two semicircles connected by parallel line segments tangent to their endpoints. All of the magnets of the second set 110 are oriented in the same polarity, which is opposite that of the magnets of the first set. For example, if the side of the magnets of the first set shown in the drawing (facing the reader) is the north pole (with their south pole facing away from the reader, or into the page), then the side of the magnets of the second set as shown in the drawing is the south pole (with their north pole facing away from the reader, or into the page).

FIG. 1B illustrates a cross section of an embodiment of the magnet arrangement, generally referred to herein as magbar, along line A-A of FIG. 1A. As shown in the orientation of FIG. 1B, and generally as referred to within this disclosure, a reference to a "down" or "front" direction would mean direction facing the target and the plasma (see FIG. 1C), while reference to "up" or "rear" direction would be facing away from the target and the plasma. As shown in FIG. 1B, keeper plate 115 is interposed between the magnets of the first set and the magnets of the second set, such that magnetic field lines (see dashed curved arrows) emanating from magnets of the first set must pass through the keeper plate in order to reach magnets of the second set. Stated another way, a straight line (see dotted arrows FIG. 1C) passing through the axis of a magnet from the second set (i.e., passing through both poles of the magnet) must intercept the keeper plate before it can reach the interior wall of the target, while a straight line (see dashed arrow) passing though the axis of magnets of the first set can reach the interior wall without crossing the keeper plate. The keeper plate is a magnetically permeable obround shaped plate that helps shape the magnetic flux over the target surface. The plate shunts the magnetic field.

The obround shaped keeper plate may have a cross-section resembling a trough of a U-shape with outwardly angled extensions at each end of the U-shape opposing the valley. The U-shaped trough is formed of a flat base 111, two parallel risers 113 extending from opposing edges of the base 111, and two outwardly angled extensions 114 extending in opposite direction from each other from the ends of the risers 113. The magnets of the first set of magnets are arranged within the valley of the U-shape on one side (or in front of) of the shaped keeper plate, while the magnets of the second set are arranged on the opposite side (or in the rear of) the shaped keeper plate, nestled in area bound by the risers 113, the extension 114 and the cover 120. Thus, when the magbar is installed within a sputtering target, the magnets of the first set have unobstructed direct line of sight to the target, while the magnets of the second set are obstructed from direct line of sight to the target by the keeper plate.

As noted, a cover 120 is provided around the second set of magnets, thereby encasing the magnets of the second set between the cover 120 and the keeper plate 115. That is, the magnets of the second set of magnets are housed within a space defined between the cover 120 and the keeper plate 115. The entire assembly of magnets and keeper plate shown in FIG. 1B may optionally be encapsulated within insulating material 112 (shown in dash-dot lines), such as, e.g., resin.

FIG. 1C is a schematic cross-section illustrating the magbar 100 installed inside the rotating cylindrical target 130. The cylindrical target 130 is coated with a sputtering layer 132 made of the material to be sputtered onto a part to be coated, e.g., SiAl for coating a glass plate. That is, sputtering layer 132 is consumed during the sputtering operation. In operation, magbar 100 is held stationary while the cylindrical target 130 rotates about its axis (perpendicular to the page), so that the area of the target from which plasma sputtering of material is performed changes with the rotation of the target. Consequently, the material of the target is consumed evenly from the entire circumference of the target.

FIG. 1D illustrates a cross-section of a sputtering chamber according to an embodiment, which utilizes a single rotating target 130. The chamber has a vacuum enclosure that may be rectangular with openings to introduce substrates in a travel direction (see double headed arrow in FIG. 1D), while the cylindrical target extends in a transverse direction which is orthogonal to the travel direction (into the page in FIG. 1D). In examples, the cylindrical target may extend for, e.g., one meter in the transverse direction.

In this example, the substrates 107 to be coated are transported on conveyor belt 17 below the target 130. The plasma 102 is confined to the area between the target and the substrate by the specific design of the magbar 100, as disclosed herein. If provisions to hold the substrate in place are provided, e.g., clips, the entire page can be held upside-down to illustrate an embodiment wherein the target is positioned below the substrates and sputtering occurs upwards. This can be done, for example, to cause any unwanted particles to be pulled downwards by gravity and avoid landing on the substrates and contaminate them.

In FIG. 1D gas injector 135 is provided to inject reactive gas, such as oxygen and/or nitrogen, that would react with the material sputtered from the target to change its composition. Also, non-reactive gas, such as argon can be injected to sustain plasma and to sputter the sputtering material 132 from the target. Thus, if the target is made of, e.g., SiAl, and the gas injected includes argon, oxygen and nitrogen, the argon species would dislodge SiAl particles from the target, which would react with the oxygen and nitrogen, so that the material deposited on the substrates would be SiAlON.

FIG. 1E illustrates an embodiment wherein two magbars 100 are placed inside a cylindrical rotating target, thus maintaining plasma sputtering over two areas of the target simultaneously. In this embodiment the substrates 107 are held vertically by carriers 17 and move in a direction in-out of the page. Injectors 135 inject gas to the space between the target and the substrates so as to interact with the material being sputtered from the target.

With the above disclosure, a sputtering system is provided, comprising: a cylindrical target having sputtering material on exterior surface thereof; a magnet arrangement provided inside the cylindrical target, the magnet arrangement comprising a first set of magnets arranged on a single straight row, each magnet of the first set having a first pole facing interior wall of the cylindrical target and a second pole facing away from the interior wall, a second set of magnets arranged in a race-track shape around the first set, each magnet of the second set having the first pole facing away from the interior wall of the cylindrical target and the second pole facing the interior wall; a keeper plate positioned between the first set of magnets and the second set of magnets, such that a straight line passing through an axis of a magnet from the second set intercepts the keeper plate prior to reaching the interior wall, while a straight line passing through an axis of a magnet from the first set reaches the interior wall without having to intercept the keeper plate; and a cover enclosing the second set of magnets between the cover and the keeper plate. The keeper plate may have a cross-section resembling a U-shape with angled extensions at each end of the U-shape opposing the valley.

Figure 2:
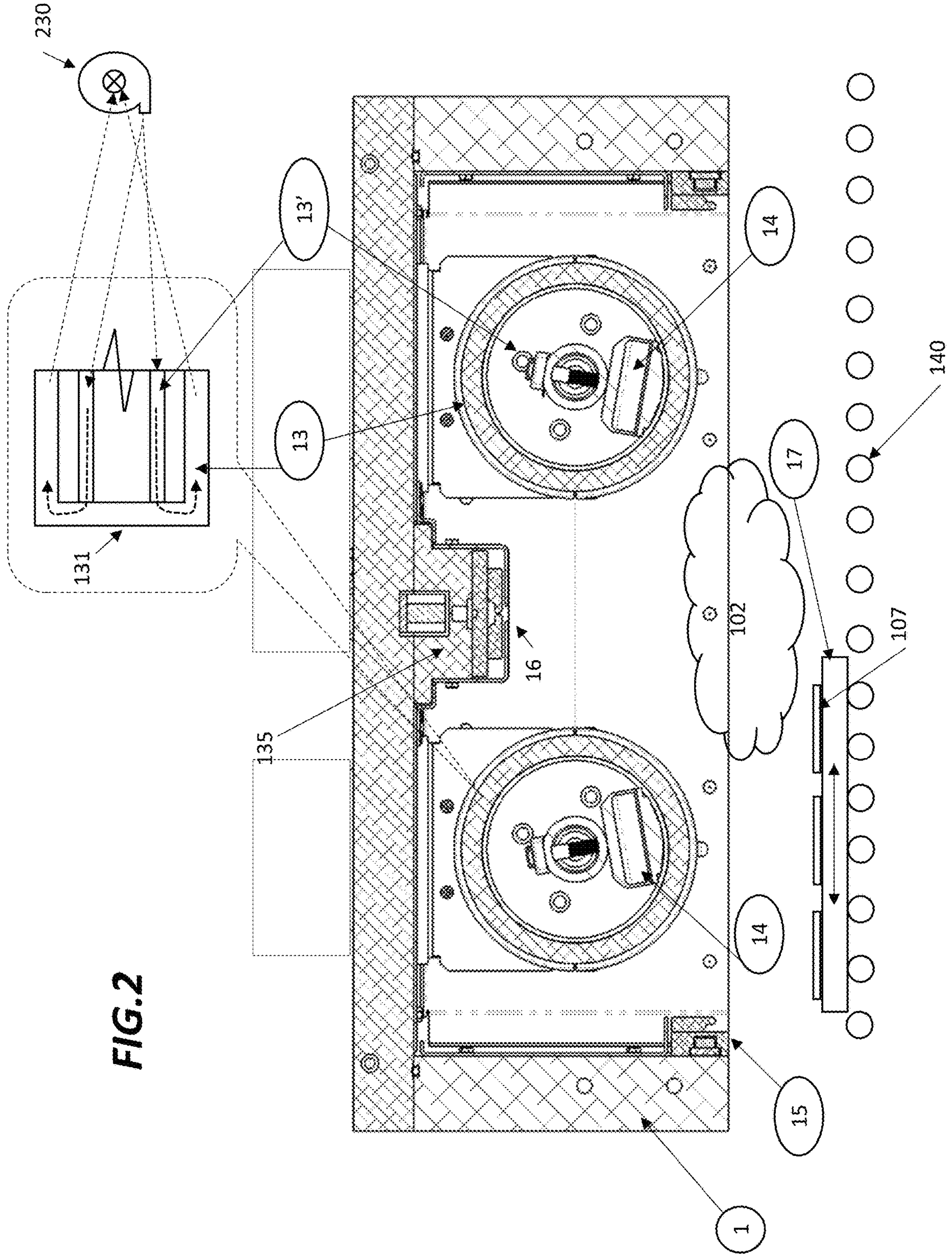

FIG. 2 illustrates an embodiment for sputtering station that utilizes two rotating targets in tandem, so as to sustain plasma in between the cathodes and sputter material from both targets concurrently. The entire arrangement shown in FIG. 2 may be placed inside a vacuum chamber to form a sputtering station in a sputtering chamber. The magbars inside the two targets may be oriented so that their axes are vertical and parallel with each other, i.e. zero tilt angle. Alternatively the magbars 14 may be angled away, or as illustrated in FIG. 2, towards each other. For example, in each target the magbar 14 can be oriented away from the vertical away or towards each other by about +/−0-60 degrees, +/−15-45 degrees, etc., e.g., +/−30 degrees, towards or away from the twin target. A zero tilt angle indicates no tilt, a negative tilt angle indicating tilt away from the twin target, and a positive angle indicating tilt towards the twin target. In this way, plasma 102 is maintained in an area between the twin targets 14 to thereby sputter material from both targets concurrently. Additionally, in this embodiment gas injector assembly 16 is positioned between the twin targets so as to inject gas in between the two targets and towards the plasma, so that the gas species is consumed by material sputtered from both targets.

Additional features shown in FIG. 2, include grounding arrangement 15 (see also FIG. 5) and target cooling arrangement. The cooling arrangement includes fluid delivery pipes 13' which deliver cooling fluid inside the target towards an end-wall of the target (see callout in FIG. 2, which shows a section of the cylindrical target in cross-section along the target's length). The pipes 13' terminate at a given prescribed distance from the end-wall and have an open end. Consequently, the fluid emanating from the pipes 13' hit the end-wall 131 and deflect back towards the fluid return sleeve 13, where it flows in the opposite direction from the flow in the pipes 13', as illustrated by the dotted arrows. As the fluid flow in the return sleeve 13 it cools the target. It is then collected at the other end (obscure in FIG. 2) and sent to a chiller 230 prior to being reflowed in pipes 13'.

FIG. 2 also illustrates a transport mechanism wherein magnetic wheels 140 are used to transport tray 17 upon which multiple substrates are placed. Embodiments of the transport mechanism will be discussed in more details below with reference to FIGS. 6-9.

A typical use of the above-mentioned setup is to convert a material from the target's stoichiometry to a film comprising an adjusted oxidation state (compared to the original material). Such films generally become dielectric and often present opportunities in the fields of optics, tribology and diffusion to name a few. The most common practice involves introduction of reactive gases (e.g., O, N, H, etc.) during processing that ultimately form the desired bonding and resultant stoichiometry in the film, e.g., SiAlON. This process will often produce an excessive amount of electrons that may cause deleterious plasma damage and heating effects and thereby inhibit film quality. One remedy utilizes an engineered anode to collect the excessive flux and thereby remove it from possible film interaction. However, the adsorbate typically insulates all surfaces on the interior of the chamber and the anode is no exception. Therefore, the plasma tends to become unstable as the anode "disappears", i.e., it's electrical potential with respect to the plasma is insulated by oxidation material build-up so that from the perspective of charged particles within the plasma, it doesn't exist.

Figure 2A:
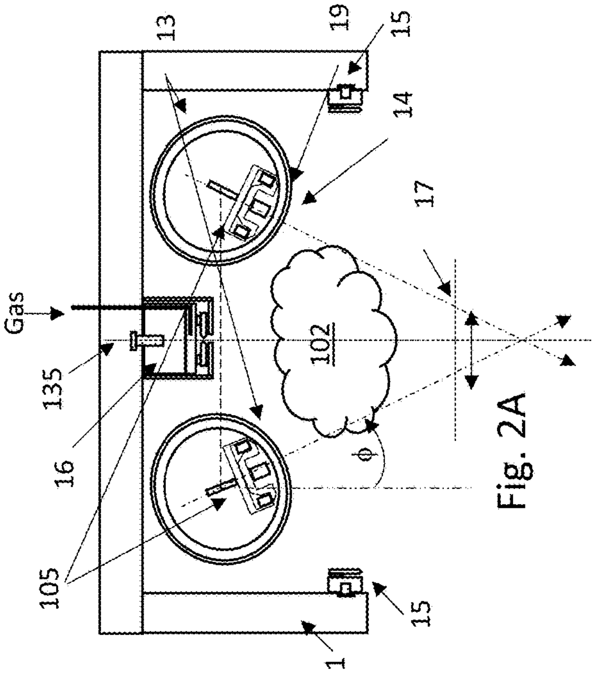
FIG. 2A illustrates a cross-section of an embodiment utilizing two rotating cylindrical targets, and includes reference lines that describe spatial orientation and relationship among the various elements of the chamber.

FIG. 2A illustrates a cross-section of an embodiment utilizing two rotating cylindrical targets, and includes reference lines that describe spatial orientation and relationship among the various elements of the chamber. As illustrated, the two magnetrons 105 within the cylindrical targets are tilted towards one another, such that plasma 102 is maintained between the two cathodes 13. Generally, the magnetrons may be oriented vertically, as shown by the dash-two-dots line, i.e., with its axis of symmetry orthogonal to the floor of the chamber, or be tilted at an angle $\phi$ from the vertical, as in FIG. 2A. Angle $\phi$ may be +/−0°-60° from the vertical, +/−15°-45° from the vertical, e.g., 30° from the vertical. In other words, the magnet arrangement is positioned with its axis of symmetry crossing the horizontal plane at an orthogonal angle of 90° or with an acute angle of up to 30°.

Each of the magnetrons defines an axis of symmetry that passes through its center, represented in FIG. 2A by the dash-dot arrows. The axes of symmetry of the two magnetrons cross each other at a point ahead of the surfaces of the rotating targets. When the two rotating targets are positioned horizontally, i.e., a straight line passing through their axis of rotation is horizontal line (see wide-dash line), the two axes of symmetry cross each other at a crossing point below the horizontal line. Additionally, a straight line connecting the crossing point and the center of gas injection assembly 135 is perpendicular to the horizontal line (see dotted line in FIG. 2A).

Figure 3:
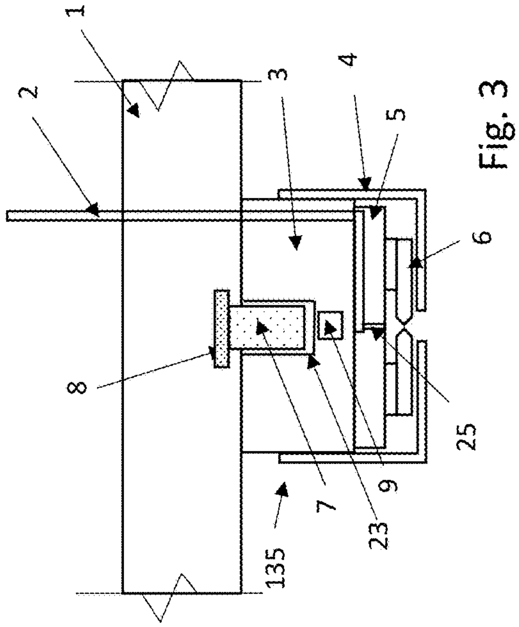
FIG. 3 schematically illustrate gas injection and grounding port according to an embodiment.

FIG. 3 is a schematic showing the features comprising the novel approach to a centralized anode incorporated within the gas injection assembly 135. It should be noted that while in FIG. 1D the gas injection assembly is shown on one sidewall of the chamber, it may actually be placed anywhere that is appropriate for gas injection, e.g., on the ceiling, as shown in FIG. 2. Also, when deployed between two cylindrical rotating targets as shown in FIG. 2, the elements of the centralized anode of FIG. 3 (e.g., anode block 3, magnet array 7, keeper plate 8, gas distribution plate 5, and filters 6 described below) may extend to the length of the cylindrical target (i.e., into the paper as shown in FIG. 2).

As shown in FIG. 3, an anode block 3 is affixed to the chamber wall 1 (or to the ceiling, FIG. 2). The anode block 3 is most appropriately metallic, e.g., aluminum or copper, or otherwise conductive material (both electrical and thermal conductivity). A magnet 7 is mounted on a keeper plate 8, which also affixes directly to the chamber wall 3 and extends into a cavity 23 within anode block 3, such that when at vacuum, there is no connective material making lateral electrical or thermal connection from the magnet 7 directly to the anode block 3. This design criteria is beneficial to inhibiting current flow directly through the magnet structure and preserves thermal stability of the magnet.

Cooling channels 9 are cut into the anode block 3 to allow coolant flow therein to control the temperature of the anode block 3. Additionally, gas delivery line 2 passes through the anode block and provides gas to at least one gas injection orifice 25. The one or more gas injection orifices are provided on a gas distribution plate 5 (also conductive material) that is attached to the top of the anode block 3 and is connected to the gas delivery line 2 to facilitate gas orifice 25 delivery of prescribed gas species to the vacuum environment. Drilled orifices of gas injector 25 are less than 2 mm and more preferably below 1.6 mm in diameter. Such specifications inhibit plasma formation within the plate 5 regardless of the possible electrical potential (as per Paschen's Law). Consequently, less secondary electron generation and consequently lower plasma density forms in the region surrounding the orifice. Also, the at least one orifice is collinear with the highest density of magnet field lines from the magnet 7.

Figure 4:
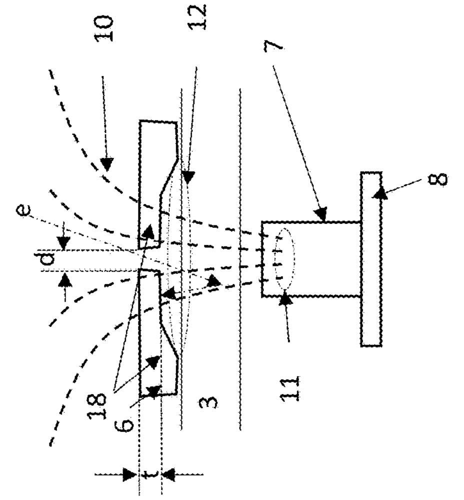
FIG. 4 schematically illustrates the operation of a grounding port according to an embodiment.

FIG. 4 demonstrates the spatial relationship for the structure of electron filter 6. This filter 6 consists of two filter bars 18 facing each other with a gap therebetween, marked as d. The filter 6 features dimensions that promote the separation of electrons following magnetic field lines from adsorbate particles following line-of-sight trajectories. Specifically, the overall thickness t of the free-standing end of the filter bar is larger, and preferably twice as thick as the distance d separating nearest edge of the mirroring filter bars 18 across the centerline of the anode structure. In embodiments the thickness t is greater than 3 millimeters and may even be greater than 5 millimeters. This collimation optimizes the competing effects of filtering and total capture of electrons. Also, the free-standing end of the filter bar is beneficially thinner than the opposite end that is attached to the anode block, thus defining a hollow area between the anode block and the filter bars.

FIG. 4 illustrates the electron mirroring benefit to ground capture. Magnetic field lines (dashed curves) 10 connect cathode arrays to the center of the anode. A region 11 (dotted oval) shows the densification of field lines as they approach the anode magnet 7. The increase in field intensity, B, causes the reflection of inbound electrons e. The likelihood of momentum transfer causes the electron to reverse course at an angle to the incidence, see dash-dot arrow marked e. As such the collection of reflected trajectories forms a loss cone that is wider than the aperture that admitted the electrons into the anode filter structure. This is represented as dotted oval 12 in FIG. 4, within the hollow space defined between the anode block 3 (or the gas distribution plate 5 if used) and the filter bars 6. The loss reflection allows electrons to then impact on fresh conductive interior surfaces of the filter bars 6, that provide ultimately a pathway to ground. In this way, the anode is kept viable regardless of coating action in the body of the chamber. That is, even if the front surface (i.e., plasma facing surface) of filter 6 gets coated with insulative material, the interior surface (i.e., surfaces hidden from the plasma) would remain exposed and therefore viable conductive pathway to ground.

Reverting to FIG. 3, this set of phenomena reduces the chance for insulating material such as oxides or nitrides to form atop the conductive metal surface of plate 5 or other local structures, such as the electron filter 6. This optimizes the anode structure for durable performance over extended campaign times. To facilitate the rigors of manufacturing, a consumable or sacrificial shield 4 attaches to the outer portion of the anode block 3, where accumulated material clings to further protect the anode from deposition of insulative material.

Figure 5:
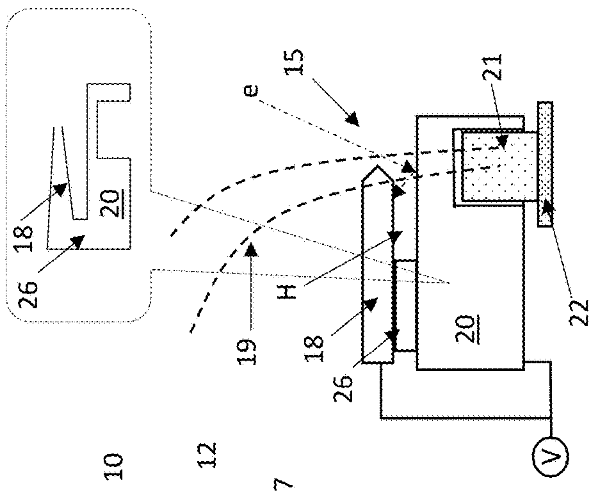
FIG. 5 illustrates a side grounding port according to an embodiment.

Another embodiment of an anode 15 is shown positioned on the sidewall of the chamber, peripherally of the cathodes 13 and detailed in FIG. 5. A peripheral anode block 20 is attached to the chamber wall 100. Instead of a dual filter structure as shown in FIG. 3, only half such an assembly is required since only one cathode's field lines 19 are connecting to the peripheral anode 15. Filter bar 18 is attached to the anode block 20, set off by spacer 26, to thereby form a peninsula connected to the anode block at its isthmus, and defining hollowed area H between the filter bar 18 and the anode block 20. In this respect, it can be said that the filter bar 18 is cantilevered off of spacer 26. Also, as illustrated in the callout, in any of the disclose embodiments, the anode block 20, spacer 26 and filter bar 18 may be made integrally as a single block having the cavity for the magnet in the rear and the cantilevered filter bar in the front. In any of the disclosed embodiments the free end of the filter bar 18 may be thinner than the attachment end which is attached to the anode block, or the entire filter bar 18 may be tapered towards its free end, as shown in the callout.

Magnet 21 is inserted into cavity in the anode block and is attached to keeper plate 22, wherein no part of the magnet 21 or keeper plate 22 physically contacts the anode block 20, such that a vacuum break is formed between the magnet 21 and keeper plate 22 and the anode block 20. The filter bar 18 is positioned so as to partially cross the magnetic lines emanating from magnet 21, so that some of the magnetic field lines cross the filter bar 18 and some field lines do not cross filter bar 18. Consequently, electrons deflected by the magnetic field would impact the interior surface of the filter bar 18 that faces away from the plasma, and thus remains uncoated by insulating species.

In any of the disclosed embodiments, the anode block may be electrically connected to the chamber body and be at the same potential as the chamber body, e.g., ground potential. Conversely, as exemplified in FIG. 5, the anode block may be insulated from the chamber body and be connected individually to a potential source V, or the filter bar may be connected to the potential source V. Also, in any of the disclosed embodiments, the magnet has a strength greater than 30 MGOe (mega-gauss-oersted). In any of the disclosed embodiments, the magnetic mirror ratio ($r=B(max)/B(min)$, where B is the magnetic field intensity) is greater than 10 and more preferably greater than 100. In this respect, magnetic mirror refers to the configuration of magnets within the anodes and cathodes to create an area with an increasing density of magnetic field lines at either end of a confinement volume. In the disclosed embodiments the end of interest is at the anode. Particles approaching the ends experience an increasing force that eventually causes them to reverse direction and return to the confinement area. This mirror effect will occur only for particles within a limited range of velocities and angles of approach, while those outside the limits will escape. In the context of the disclosed embodiments, electrons would be deflected to reverse direction and hit the interior side of the electron filter, which is not exposed to insulative coating, thus ensuring clear path to ground for removal of electrons from the plasma.

With the above disclosure, a sputtering station is provided, comprising: a chamber enclosure having a ceiling; a gas injector assembly positioned to deliver processing gas into the chamber enclosure; a grounding anode mounted onto the enclosure wall; and at least one cathode assembly, the cathode assembly comprising a rotatable cylindrical target having sputtering material on exterior surface thereof, a magnet arrangements positioned inside the cylindrical target in a fixed-non rotating orientation, the magnet arrangement including a first set of magnets arrange on a straight line, wherein all of the magnets of the first set are oriented at same polarity, and a second set of magnets arranged in an obround shape, wherein all of the magnets of the second set are oriented at same polarity opposite polarity of the first set of magnets; a keeper plate interposed between the first set of magnets and the second set of magnets wherein the first set of magnets is positioned against one surface of the keeper plate and the second set of magnets is positioned against an opposite surface of the keeper plate, such that magnetic field lines emanating from the first set of magnets pass through the keeper plate in order to reach the second set of magnets.

The sputtering station may further comprise a plurality of cooling pipes having receiving end coupled to a chiller and at the opposite side an open end terminating a prescribed distance from an end-wall of the target, the target further comprising a return sleeve situated inwardly of the sputtering material, such that cooling fluid flowing in the cooling pipe exit the open end to space between the open end of the cooling pipes and the end-wall, and thence flow into the return sleeve.

The disclosed embodiments provide a deposition system comprising: a vacuum enclosure having sidewalls and ceiling, two sputtering targets positioned inside the vacuum enclosure and defining a plasma area therebetween, each of the sputtering targets having a front surface coated with sputtering material and a back surface, the front surface facing the plasma area; two magnetrons, each positioned behind the back surface of a corresponding one of the two targets; a gas injector mounted onto the ceiling and positioned centrally between the two targets; and a central anode mounted onto the ceiling and positioned centrally between the two targets, the central anode having an anode block and a magnet positioned within the anode block; wherein the two targets, the two magnetrons, and the anode confine plasma within the plasma area to have a slope of log(I) vs. log(V) greater than at least 3 or greater than 4. In embodiments the deposition system further comprises two peripheral anodes, each mounted onto the sidewall and positioned next to a corresponding one of the two targets, each of the peripheral anode comprising an anode block having a cavity, a magnet positioned within the cavity and generating magnetic field lines, and a cantilevered filter bar intercepting at least partially the magnetic field lines.

Also disclosed is a plasma chamber comprising a vacuum enclosure housing a target having a front surface facing a plasma region within the vacuum enclosure and a rear surface facing away from the plasma region, the front surface being coated with sputtering material; a magnetron positioned behind the rear surface igniting the plasma and confining the plasma to the plasma region; an anode position inside the vacuum enclosure and incorporating an electron filter having exposed surface facing the plasma region and a hidden surface facing away from the plasma region, the electron filter generating a mirroring effect to deflect electrons onto the hidden surface. In embodiments, the electron filter maintains magnetic mirror ratio (r=B(max)/B(min), where B is the magnetic field intensity) greater than 10, and more preferably greater than 100. In embodiments, the electron filter incorporates a magnet having strength greater than 30 MGOe. In embodiments, the target is shaped as elongated cylinder and the filter extends to the length of the target, wherein the magnet is formed as an array of magnets extending the length of the target.

Figure 6:
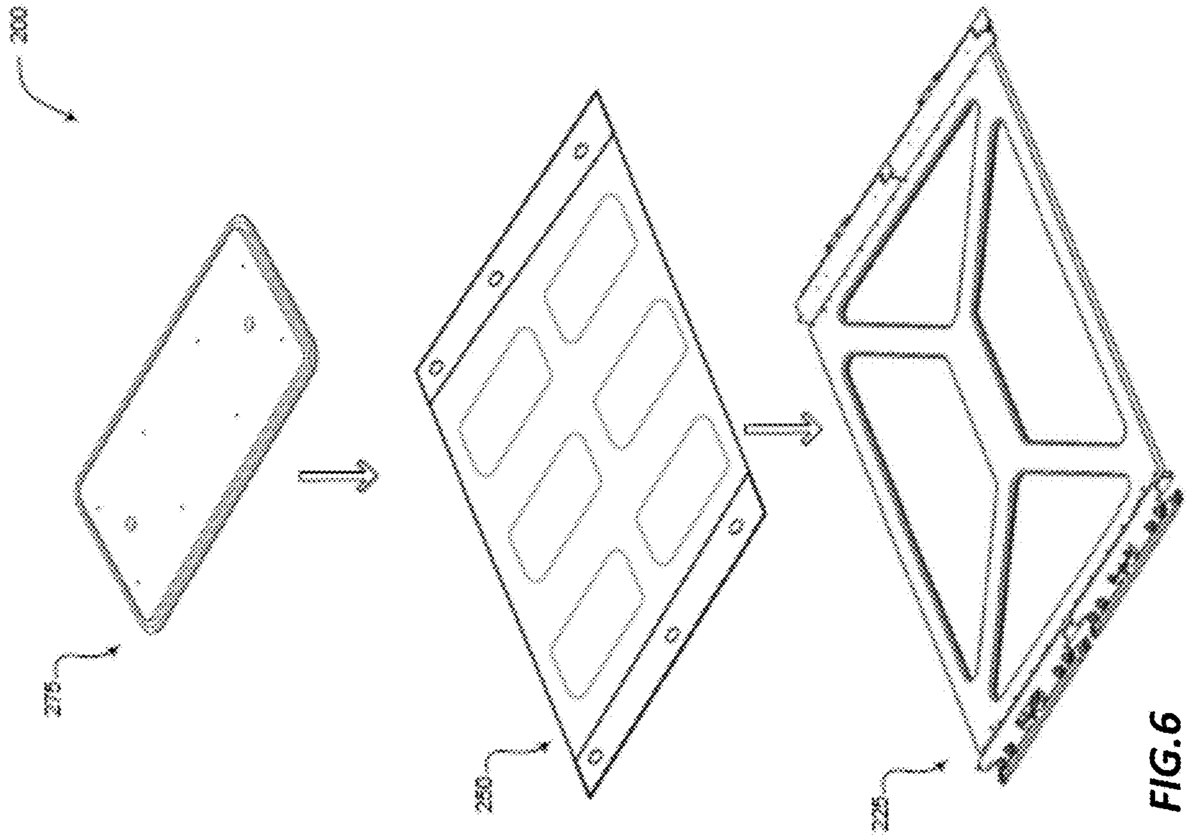
FIG. 6 is a schematic illustrating an exploded view of the carrier and the transport mechanism for substrates, according to an embodiment.

FIG. 6 illustrates in exploded view the overall construction of an embodiment of a substrate carrier 200. The substrate carrier includes three main parts: a carrier base 225, a carrier tray 250, and one or more substrate pedestals 275. The three main parts are assembled as illustrated to form the substrate carrier. Carrier base 225 is the lowermost part of the substrate carrier that supports the other two main parts and also provides an interface by which the substrate carrier can be coupled to a transport system such as the rail and wheels system shown in FIG. 2. Details of an embodiment of carrier base 225 are discussed below in connection with FIGS. 7A-7C.

Carrier tray 250 is a middle part of the substrate carrier that provides an interface between the carrier base and the substrate pedestals and also supports the substrate pedestals (here shown with arrangement supporting six pedestals as but one example). Carrier tray 250 is placed on carrier base 225, using alignment features such as pins and holes, to ensure that the carrier tray is securely engaged with the carrier base and to ensure that the tray's alignment with the carrier base is accurate and repeatable. Details of an embodiment of carrier tray 250 are discussed below in connection with FIGS. 8A-8C.

One or more substrate pedestals 275 are placed on carrier tray 250 to complete the substrate carrier. The illustrated embodiment shows only a single substrate pedestal being assembled onto carrier tray 250, but other embodiments can have multiple pedestals per carrier tray. Details of an embodiment of carrier pedestal 275 are discussed below in connection with FIG. 9A-9C.

Figure 7C:
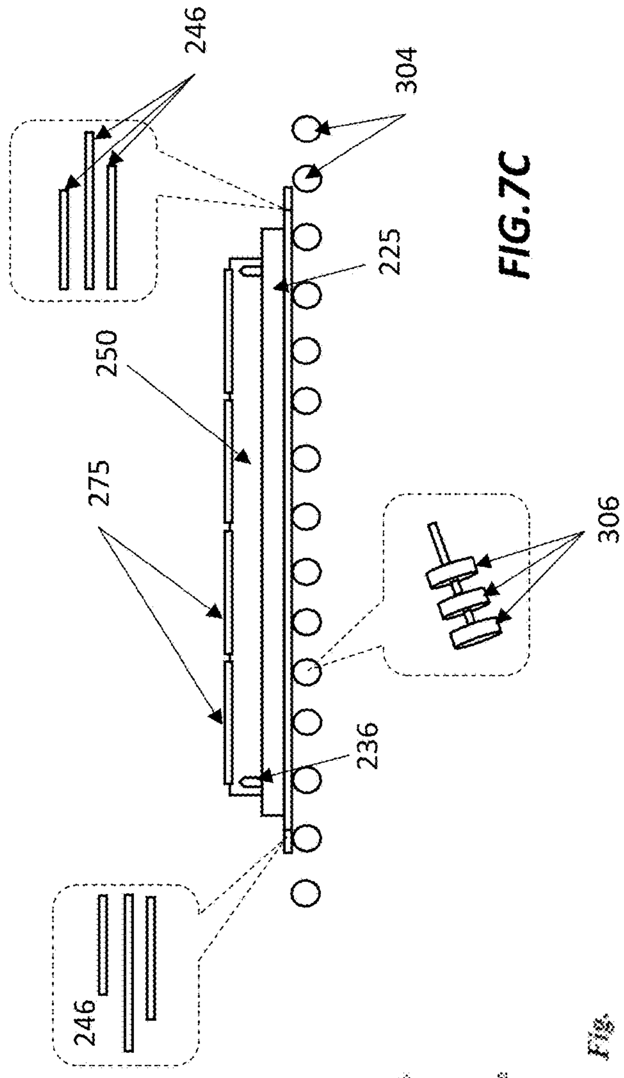
FIGS. 7A-7C are schematics illustrating a carrier base and the transport mechanism for substrates, according to an embodiment.
Figure 7A:
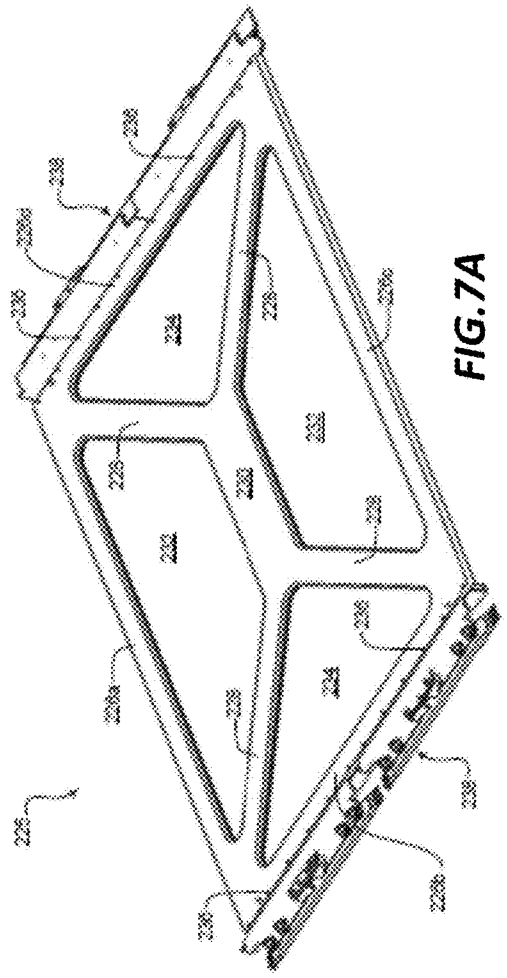
Figure 7B:
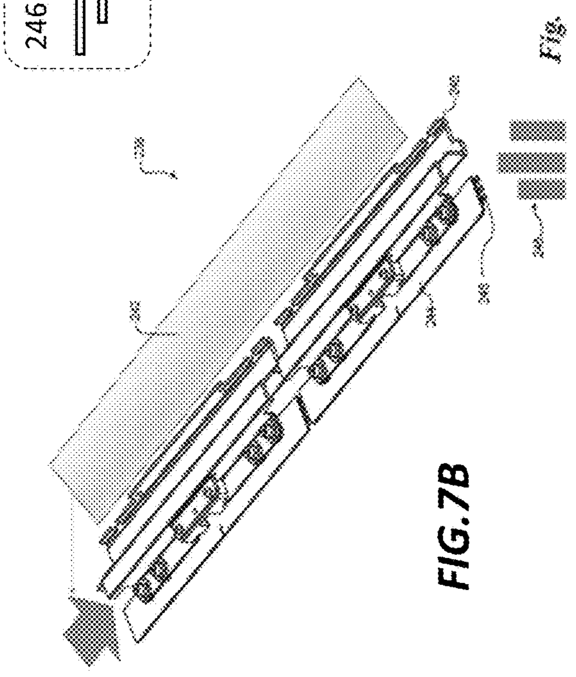

FIGS. 7A-7C illustrate details of an embodiment of a carrier base 225. FIG. 7A illustrates the carrier base, while FIG. 7B the details of an embodiment of a transport interface by which the carrier base can be coupled to a transport system such as the rail-based transport system illustrated in FIG. 7C.

Carrier base 225 is quadrilateral in shape (here rectangular), although other embodiments need not be quadrilateral. The carrier base includes a thick rigid web body with edge supports 226*a*-226*d*, each positioned along one edge of the quadrilateral. The thickness of the rigid web body will depend on the material properties of the material used, the configuration of supports, and the expected loads. Generally, the thickness can be set so that the rigid web body can support the carrier tray, substrate pedestals, adjusters, and substrates with little or no deformation, so that the position and orientation of the substrates is not substantially affected by deformation of the carrier base. In one embodiment, for instance, the thickness of the rigid web body is greater than the thickness of the carrier tray, but in other embodiments the rigid web body can have the same or less thickness than the carrier tray, depending on the configuration and material of the rigid web body. A central support 230 is connected to edge supports 226 by diagonal supports 228. The illustrated embodiment has four diagonal supports 228 that connect central support 230 to the corners where each pair of edge supports 226 meet. This arrangement results in four voids or open areas—two trapezoidal voids 232 and two triangular voids 234—that reduce weight while also providing for support of carrier trays 250 and pedestals 275 without sagging or warping at process temperatures. Other embodiment of carrier base 225 can configure the carrier base differently than shown—for instance, with other configurations of supports 226, 228, and 230, or with different numbers of supports, different support shapes and dimensions, and different connections between supports. Transport interfaces 238 are positioned on opposite edges 226*b* and 226*d* in the illustrated embodiment, but can be positioned differently in other embodiments or when used with other types of transport system.

Carrier base 225 also includes alignment pins 236 for accurate and repeatable positioning, and rapid loading and unloading, of other substrate carrier components such as carrier tray 250. Generally, other components that will be placed on carrier base 225 will have corresponding alignment holes to receive and engage alignment pins 236. In the illustrated embodiment alignment pins 236 are positioned on opposite edges 226*b* and 226*d* of the carrier base, but in other embodiments the alignment pins can be positioned differently and distributed differently than shown. In other embodiments, carrier base can include alignment holes instead of alignment pins, in which case the other components can include alignment pins instead of alignment holes. In still other embodiments, other alignments features can be used, such as corner stops that engage corners of the carrier tray or edge stops that engage edges of the tray.

FIG. 7B illustrates details of an embodiment of transport interface 238, by which carrier tray 225 is coupled to a transport system. Transport interfaces 238 couple the carrier base to a rail transport system through carrier feet 244 and include a drive-side guide 240 that overlaps chamber guide flange 242 to guide the substrate carrier along a transport direction. Transport interfaces 238 also include transport feet 244 with magnetic toes 246, shown in the expanded view. In one embodiment, magnetic toes 246 are made of magnetic material and ride on wheels positioned within the chamber. The magnetic toes 246 have different toe lengths to increase the coefficient friction and come off magnetic wheels at different times in response to applied force as the carrier moves from one section to the other. This makes the transition from one section to another smoother, since the toes move from one wheel to the next in sequence, rather than all together at the same time.

FIG. 7C illustrates an embodiment of a substrate carrier such as carrier 200 used with a transport system. As described above, substrate carrier 200 includes three main parts: carrier base 225, carrier tray 250 and one or more substrate pedestals 275. The substrate carrier uses a transport interface such as interface 238, described above, to couple to a transport system 302. Transport interface 238 engages with multiple magnetic wheel assemblies 304 of the transport system, and each magnetic wheel assembly includes three wheels 306. Each carrier foot 244 includes three magnetic toes 246, each of which is a magnetic bar that rides on one of the three wheels 306. The three magnetic toes 246 have different lengths; in the illustrated embodiment the central toe is the longest and one of the outer toes the shortest, but in other embodiments the toes could be ordered differently than shown. The three toes increase the coefficient friction and come off magnetic wheel at different times in response to applied force as the carrier moves from one section of transport system 302 to another.

Figure 8A:
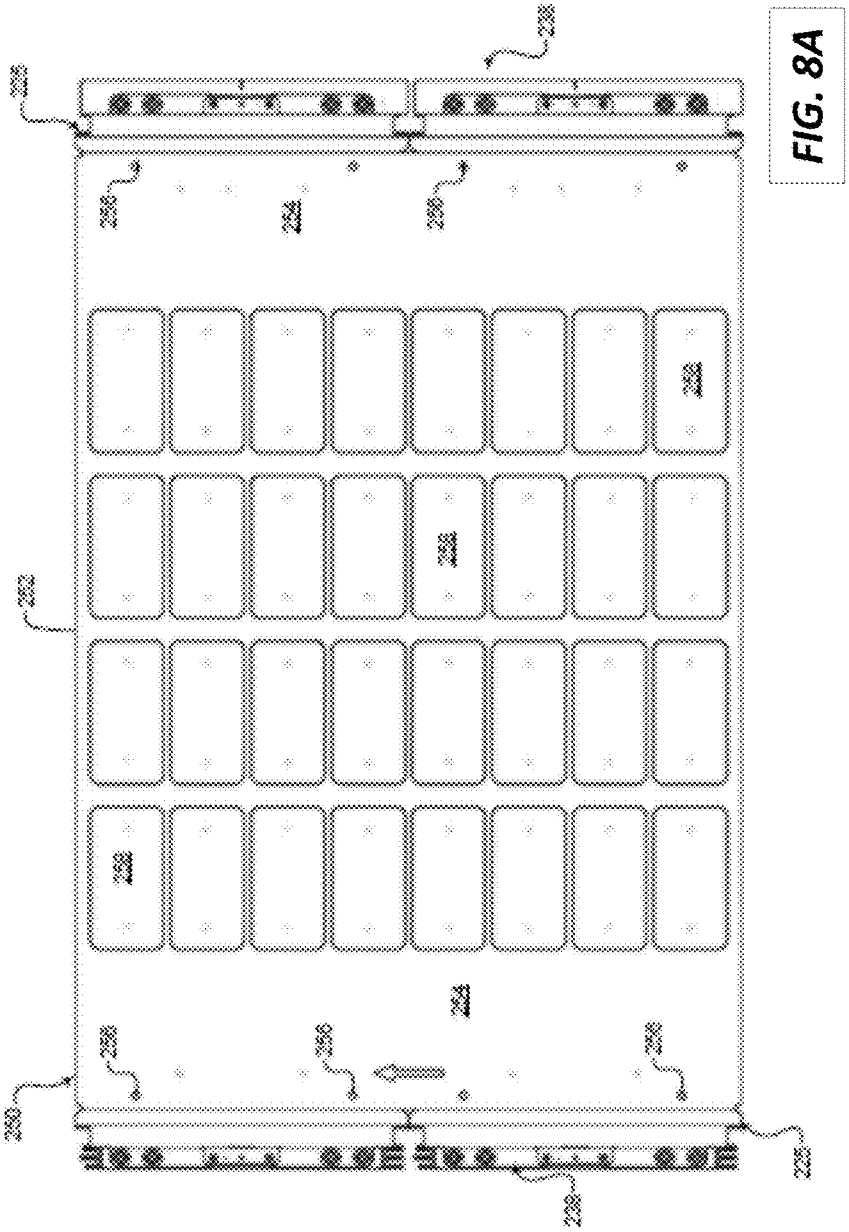
FIGS. 8A-8C are schematics illustrating a top and side views of carrier tray for substrates positioned on top of the carrier base, according to an embodiment.
Figure 8C:
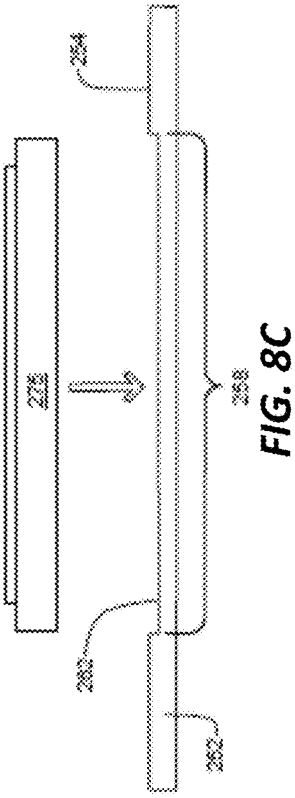
Figure 8B:
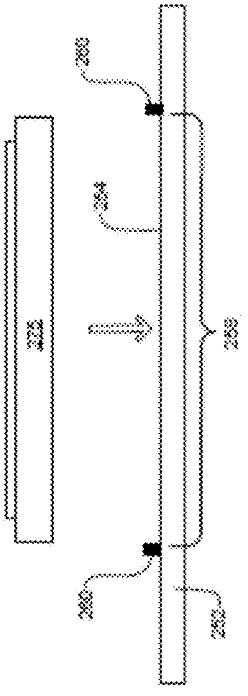

FIGS. 8A-8C illustrate embodiments of a carrier tray 250. FIG. 8A shows carrier tray 250 positioned on carrier base 225 and illustrates its basic construction. FIGS. 8B-8C illustrate embodiments of pedestal positions on the carrier tray.

Carrier tray 250 includes a thin tray 252 with a substantially flat deposition surface 254 that can provide a uniform sputter surface for deposition. In some embodiments, deposition surface 254 can include a rough surface to minimize coating delamination, including arc spray surface coating. In an embodiment where carrier base 225 includes alignment pins 236, thin tray 252 can include alignment holes 256 that engage the alignment pins to accurately and repeatably align the carrier tray on the carrier base. The illustrated embodiment has eight alignment holes 256 positioned along opposite edges of thin tray 252, with four alignment holes along each edge. Other embodiment can use a different number of alignment holes and can position and distribute them differently than shown. And in embodiments where carrier base 225 uses alignment holes instead of alignment pins 236, carrier tray 250 can correspondingly use alignment pins instead of alignment holes 256.

Carrier tray 250 also includes pedestal positions 258. The pedestal positions are an N×M set of positions, wherein $N \geq 1$ and $M \geq 1$. In an embodiment where $M=N=1$ there is a single pedestal position, but embodiments where $M \geq 1$, $N \geq 1$, or both, will have multiple pedestal positions. The illustrated embodiment has an 8×4 set of positions 258 arranged in a regular array, but other embodiments can of course have different numbers of positions (see, e.g., FIG. 6). In other embodiments positions 258 also need not form a regular array; they can form an irregular array, or no array at all. In one embodiment of carrier tray 250 all pedestal positions are the same—same size, same shape, same delineation—but in other embodiments all pedestal positions need not be the same.

FIGS. 8B-8C illustrate embodiments of pedestal positions 258. Each pedestal position 258 is sized and shaped to receive a corresponding pedestal 275, but the pedestal positions can be delineated differently in different embodiments. In the embodiment of FIG. 4B, for instance, pedestal position 258 can be bounded by stops 260 positioned around some or all of the position's perimeter. In the embodiment of FIG. 4C, a pedestal position 258 can be bounded by the edges of a surface depression 262 formed in thin tray 252. In other embodiments the pedestal positions can be formed differently; for instance, they can simply be marked on deposition surface 254. As further discussed below in connection with FIGS. 9B-9C, one or more pedestal positions 258 can include an adjuster by which the height, angular orientation, or both, of the pedestal's working surface can be adjusted. Adjusters positioned in the pedestal positions provide a mechanism to adjust the target-to-substrate distance or tilt of each substrate normal away from directly perpendicular to the substrate based on the height of the pedestal mounts.

Figure 9A:
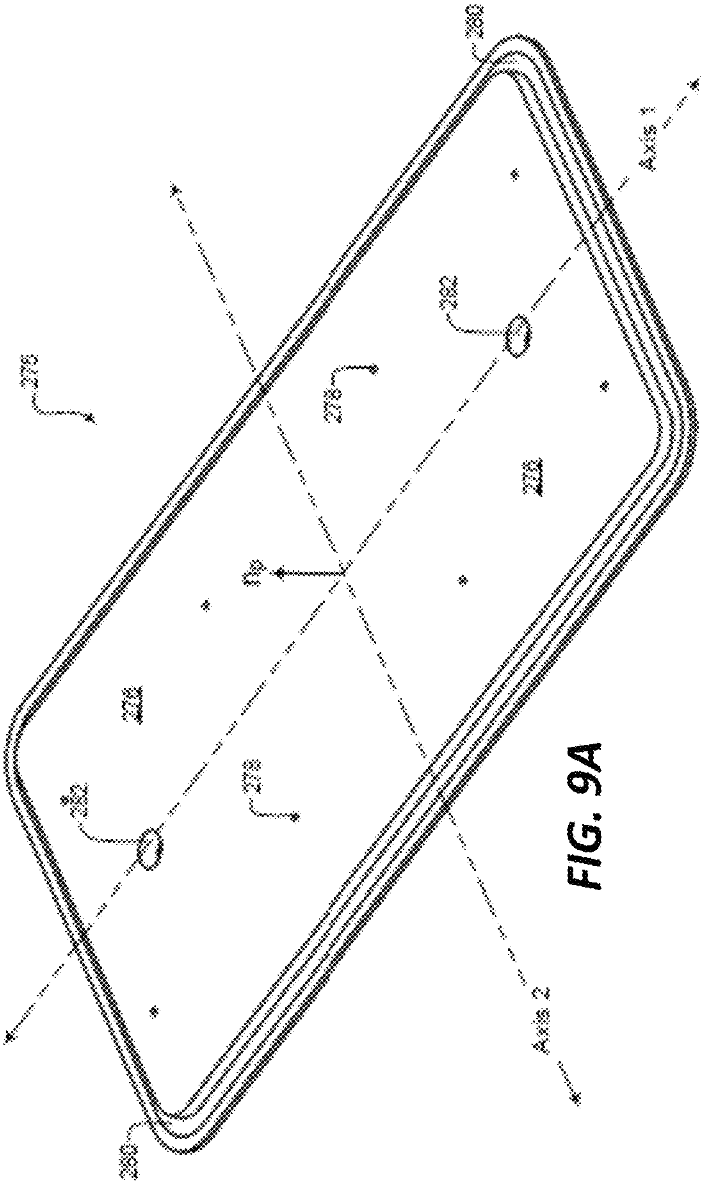
FIGS. 9A-9C are schematics illustrating a pedestal for substrates to be positioned on the carrier tray with or without an adjuster, which is positioned on top of the carrier base, according to an embodiment.

FIG. 9A illustrates an embodiment of a carrier pedestal 275. Pedestal 275 can include a smooth and substantially flat working surface 276 to receive a substrate placed on the pedestal. Vent holes 278 prevent trapped gas from affecting part alignment upon vacuum system entry. Trench 280 is positioned to just cover the edge of the substrate and prevent edge or back-side deposition without shadowing the front-side deposition. Pedestal 275 can be made of a material with high thermal conductivity, such as aluminum, for temperature control during deposition.

Pedestal 275 has two orthogonal axes, Axis 1 and Axis 2, and the angular orientation of working surface 276 can be adjusted by rotating the pedestal about either or both axes. Put differently, working surface 276 has a normal vector np whose direction can be changed by rotating the pedestal about Axis 1, Axis 2, or both Axis 1 and Axis 2. When a substrate is mounted or held on working surface 276, changing the orientation of the working surface results in a corresponding change of orientation of the substrate. Rotation and translation of pedestal 275 can be accomplished with an adjuster in a pedestal position in which pedestal 275 is put. Adjusters can be any device, mechanism, or object that enables rotation and translation of the pedestal relative to the tray. Some embodiments of adjusters can use simple or complex mechanisms that can be set to any position or angle, while other embodiments can be simple objects such as blocks or shims. Some embodiments of adjusters are shown in FIGS. 9B-9C.

The illustrated embodiment of carrier pedestal 275, with substantially flat working surface 276, is appropriate for mounting a three-dimensional substrate with a mostly flat surface and curves near the edges. But in other embodiments working surface 276 need not be flat; mounts for a wide variety of substrates of different shapes and sizes, having flat surfaces or complex three-dimensional shapes, can be constructed. Whether working surface 276 is flat or not, its angular orientation can be adjusted as described above using the adjuster in the corresponding pedestal position.

Figure 9C:
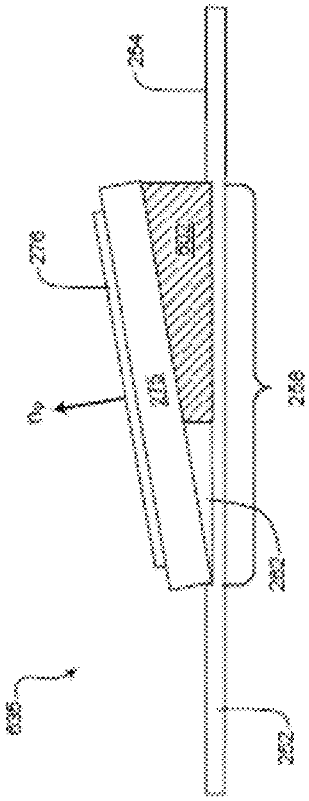
Figure 9B:
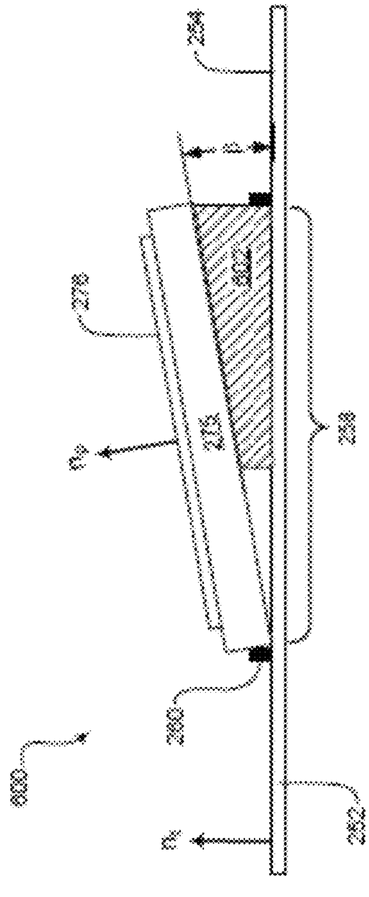

FIGS. 9B-9C illustrate embodiments of adjusters in a pedestal position. The adjusters that can be used to adjust the angular orientation and position of the pedestal and its working surface relative to the carrier tray through rotation, translation, or both, of the pedestal relative to the carrier tray. By adjusting the position and orientation of the working surface, the substrate normal axis can be tilted to match the local average lateral angle of incidence and optimize coverage uniformity. The substrate surface plane can also be raised or lowered to adjust sputter source-to-substrate distance to tune both deposition and film stress. When used in a deposition chamber such as the one shown in FIGS. 1D, 1E, and 2, adjustment of the working surface's position and angular orientation relative to the carrier tray results in a corresponding adjustment of the working surface's position and angular orientation relative to the sputtering source.

FIG. 9B illustrates an embodiment of an adjuster 600 positioned between pedestal position 258 and its corresponding pedestal 275. Adjuster 600 uses a wedge shim 602 with a pedestal position such as the one of FIG. 8B, where the pedestal position is delimited by stops 260. Wedge shim 602 with wedge angle β is positioned in pedestal position 258 abutting a stop 260, and pedestal 275 is then lowered onto the wedge shim. Stops 260 prevent the pedestal and wedge shim from sliding laterally. The wedge shim changes the orientation of working surface 276, with the shim's angle β tilting the working surface's normal vector $n_p$ by β degrees relative to the normal vector $n_t$ of deposition surface 254. In different embodiments, wedge angle β can be any value between 0 degrees and 75 degrees. Also, in some embodiments wedge shim 602 can be a compound wedge that simultaneously tilts normal vector about multiple axes, for instance about Axis 1 and Axis 2 shown in FIG. 9A. Wedge shim 602 can include holes therein (not shown in the figure) that fluidly couple with pedestal vent holes 278 (see FIG. 9A) to allow the vent holes to perform their venting function.

FIG. 9C illustrates another embodiment of an adjuster 635. Adjuster 635 is in most respects similar to adjuster 600, but can be used in embodiments where pedestal position 258 delimited by surface depression 262 formed in tray 252. In this embodiment, then, wedge shim 602 can be held in place by the edges of surface depression 262, so that the edges prevent the shim and the substrate pedestal from moving laterally.

With the above disclosure a sputtering chamber is provide, comprising: a vacuum chamber; a cylindrical target within the vacuum chamber and having sputtering material on exterior surface thereof; a magnet arrangement provided inside the cylindrical target, the magnet arrangement comprising a first set comprising a plurality of magnets arranged on a single straight row, each magnet of the first set having a first pole facing interior wall of the cylindrical target and a second pole facing away from the interior wall, a second set comprising a plurality of magnets arranged in a obround shape around the first set, each magnet of the second set having the first pole facing away from the interior wall of the cylindrical target and the second pole facing the interior wall; a keeper plate positioned between the first set of magnets and the second set of magnets, such that a straight line passing through an axis connecting the first pole and the second pole of a magnet from the second set intercepts the keeper plate prior to reaching the interior wall, while a straight line passing through an axis connecting the first pole and the second pole of a magnet from the first set reaches the interior wall without having to intercept the keeper plate; and a carrier tray having a deposition surface; an N×M set of pedestal positions on the deposition surface, wherein N≥1 and M≥1, wherein each pedestal position is adapted to receive a corresponding substrate pedestal, and wherein each pedestal has a working surface adapted to receive a substrate; and one or more adjusters, each positioned in a corresponding pedestal position, wherein each adjuster can adjust a distance between the deposition surface and the working surface, an angular orientation of the working surface relative to the deposition surface, or both.

While the disclosed embodiments are described in specific terms, other embodiments encompassing principles of the invention are also possible. Further, operations may be set forth in a particular order. The order, however, is but one example of the way that operations may be provided. Operations may be rearranged, modified, or eliminated in any particular implementation while still conforming to aspects of the invention.

All directional references (e.g., upper, lower, upward, downward, left, right, leftward, rightward, top, bottom, above, below, etc. are only used for identification purposes to aid the reader's understanding of the embodiments of the present invention, and do not create limitations, particularly as to the position, orientation, or use of the invention unless specifically set forth in the claims. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other.

In some instances, components are described with reference to "ends" having a particular characteristic and/or being connected to another part. However, those skilled in the art will recognize that the present invention is not limited to components which terminate immediately beyond their points of connection with other parts. Thus, the term "end" should be interpreted broadly, in a manner that includes areas adjacent, rearward, forward of, or otherwise near the terminus of a particular element, link, component, member or the like. It is intended that all matter contained in the above description or shown in the accompanying drawings shall be interpreted as illustrative only and not limiting. Changes in detail or structure may be made without departing from the spirit of the invention as defined in the appended claims.

It must be noted that as used herein and in the appended claims, the singular forms "a", "an", and "the" include plural referents unless the context clearly dictates otherwise.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention.

What is claimed is:

1. A sputtering system, comprising:

a cylindrical target having sputtering material on exterior surface thereof;

a magnet arrangement provided inside the cylindrical target, the magnet arrangement comprising a first set comprising a plurality of magnets arranged on a single straight row, each magnet of the first set having a first pole facing interior wall of the cylindrical target and a second pole facing away from the interior wall, a second set comprising a plurality of magnets arranged in a obround shape around the first set, each magnet of the second set having the first pole facing away from the interior wall of the cylindrical target and the second pole facing the interior wall;

a keeper plate positioned between the first set of magnets and the second set of magnets, such that a straight line passing through an axis connecting the first pole and the second pole of a magnet from the second set intercepts the keeper plate prior to reaching the interior wall, while a straight line passing through an axis connecting the first pole and the second pole of a magnet from the first set reaches the interior wall without having to intercept the keeper plate; and a cover enclosing the second set of magnets between the cover and the keeper plate.

2. The sputtering system of claim 1, wherein the keeper plate has a cross-section resembling a U-shape with angled extensions at each end of the U-shape opposing the valley and extending outwardly.

3. The sputtering system of claim 1, wherein the first set, the second set and the keeper plate are embedded in insulative material.

4. The sputtering system of claim 1, wherein the first set, the second set and the keeper plate are embedded in resin.

5. A sputtering system comprising:

a cylindrical target having sputtering material on exterior surface thereof;

a first magnet arrangement provided inside the cylindrical target, the first magnet arrangement comprising:

a first set comprising a plurality of magnets arranged on a single straight row, each magnet of the first set having a first pole facing interior wall of the cylindrical target and a second pole facing away from the interior wall, a second set comprising a plurality of magnets arranged in a obround shape around the first set, each magnet of the second set having the first pole facing away from the interior wall of the cylindrical target and the second pole facing the interior wall;

a keeper plate positioned between the first set of magnets and the second set of magnets, such that magnetic field lines emanating from magnets of the first set must pass through the keeper plate in order to reach magnets of the second set; and a cover enclosing the second set of magnets between the cover and the keeper plate;

wherein the keeper plate has a cross-section comprising a flat base, two parallel risers extending from opposing edges of the base, and two outwardly angled extensions extending in opposite direction from each other from the ends of the risers.

6. The sputtering system of claim 5, further comprising a plurality of cooling pipes having receiving end coupled to a chiller and at the opposite side an open end terminating a prescribed distance from an end-wall of the target, the target further comprising a return sleeve situated inwardly of the sputtering material, such that colling fluid flowing in the cooling pipe exit the open end to space between the open end of the cooling pipes and the end-wall, and thence flow into the return sleeve.

7. The sputtering system of claim 5, further comprising a second magnet arrangement provided inside the cylindrical target and having identical structure as the first magnet arrangement.

8. The sputtering system of claim 7, wherein the first magnet arrangement and the second magnet arrangement are oriented at 180 degrees opposite of each other.

9. The sputtering system of claim 8, further comprising substrate carriers transporting substrates in a vertical orientation at two opposing sides of the cylindrical target.

10. The sputtering system of claim 5, wherein the angled extensions cover the second pole of the magnets of the second set.

11. The sputtering system of claim 5, wherein the magnets of the second set are house in a space enclosed by the cover and the risers and angled extensions of the keeper plate.

12. A sputtering system, comprising:

a. a vacuum enclosure having a ceiling, sidewall and floor;

b. transport tracks provided over the floor for transporting substrates in a transport direction on a first horizontal plane;

c. a first cylindrical target positioned within the vacuum enclosure and having sputtering material on exterior surface thereof, the first cylindrical target rotating about its first rotational axis;

d. a magnet arrangement provided inside the cylindrical target, the magnet arrangement comprising a first set of magnets arranged on a single straight row, each magnet of the first set having a first pole facing interior wall of the cylindrical target and a second pole facing away from the interior wall, a second set of magnets arranged in a race-track shape around the first set, each magnet of the second set having the first pole facing away from the interior wall of the cylindrical target and the second pole facing the interior wall;

e. a keeper plate positioned between the first set of magnets and the second set of magnets, such that a straight line passing through an axis of a magnet from the second set intercepts the keeper plate prior to reaching the interior wall, while a straight line passing through an axis of a magnet from the first set reaches the interior wall without having to intercept the keeper plate; and f. a cover enclosing the second set of magnets between the cover and the keeper plate.

13. The system of claim 12, wherein the keeper plate has a cross-section resembling a U-shape with angled extensions at each end of the U-shape opposing valley of the U-shape.

14. The system of claim 12, wherein the magnet arrangement has an axis of symmetry, and wherein the magnet arrangement is positioned with its axis of symmetry crossing the horizontal plane at an angle of $90^{0}$-$30^{0}$.

15. The system of claim 12, further comprising a second cylindrical target having second rotational axis, wherein the first rotational axis and the second rotational axis are parallel and lie on a second horizontal plane above the first horizontal plane.

16. The system of claim 12, further comprising an anode positioned on the ceiling between the first cylindrical target and the second cylindrical target, the anode comprising:

an anode block having a front surface to face a plasma and a rear surface to face away from the plasma;

a magnet positioned within the anode block and generating magnetic field lines extending outwardly from the front surface of the anode block;

an electron filter bar spaced apart and extending over the front surface of the anode block and intercepting at least part of the magnetic field lines.

17. The system of claim 16, wherein the magnet is inserted within a cavity formed in the anode block, the cavity being larger than the magnet, such that no part of the magnet physically contacts any part of the anode block.

18. The system of claim 17, wherein the anode block includes cooling channels configured for cooling fluid flow.

19. The system of claim 17, wherein the electron filter bar forms a cantilever having a free end and an attachment end, and wherein the free end is thinner than the attachment end.

20. The system of claim 17, wherein the anode further comprises a second filter bar spaced apart and extending over the front surface of the anode block and oriented to mirror the orientation of the electron filter bar and defining a gap between the electron filter bar and the second filter bar.

21. The system of claim 20, wherein the gap is smaller than thickness of free end of the electron filter bar.

* * * * *